US00RE37281E

(19) United States
(12) Reissued Patent
Motegi

(10) Patent Number: US RE37,281 E
(45) Date of Reissued Patent: Jul. 17, 2001

(54) BATTERY VOLTAGE ALARM APPARATUS

(75) Inventor: Takamasa Motegi, Kawasaki (JP)

(73) Assignee: Matsushita Electric Industrial Co., Ltd., Osaka (JP)

(21) Appl. No.: 08/589,332

(22) Filed: Jan. 22, 1996

Related U.S. Patent Documents

Reissue of:
(64) Patent No.: 5,304,986
Issued: Apr. 19, 1994
Appl. No.: 07/920,907
Filed: Jul. 28, 1992

(30) Foreign Application Priority Data

Aug. 21, 1991 (JP) ..... 3-209181

(51) Int. Cl.[7] ..... G08B 21/00
(52) U.S. Cl. ..... 340/636; 320/DIG. 21; 320/DIG. 18; 324/435
(58) Field of Search ..... 340/636; 320/DIG. 18; 324/435

(56) References Cited

U.S. PATENT DOCUMENTS 4,536,757 * 8/1985 Ijntema ..... 340/636
4,547,770 * 10/1985 Suzuki et al. ..... 340/636
4,660,027 * 4/1987 Davis ..... 340/636
4,755,816 * 7/1988 De Luca ..... 340/636
5,140,310 * 8/1992 DeLuca et al. ..... 320/48
5,424,721 * 6/1995 Asai ..... 340/636

FOREIGN PATENT DOCUMENTS 59-100869 * 6/1984 (JP) ..... 340/636
217830 1/1990 (JP) .

* cited by examiner

*Primary Examiner*—Edward Lefkowitz
(74) *Attorney, Agent, or Firm*—Stevens, Davis, Miller & Mosher, LLP

(57) ABSTRACT

There is provided a battery voltage alarm apparatus which announces the necessity of battery exchange when battery voltage falls below a predetermined level. The battery voltage alarm apparatus has a battery voltage detector, and a plurality of steps of detection levels for raising battery low voltage alarm are set and alarm sounds generated at individual levels are made to be different from each other. An alarm raised at a higher level is made to be an intermittent singing or a low-volume singing in order to reduce power consumption.

39 Claims, 5 Drawing Sheets

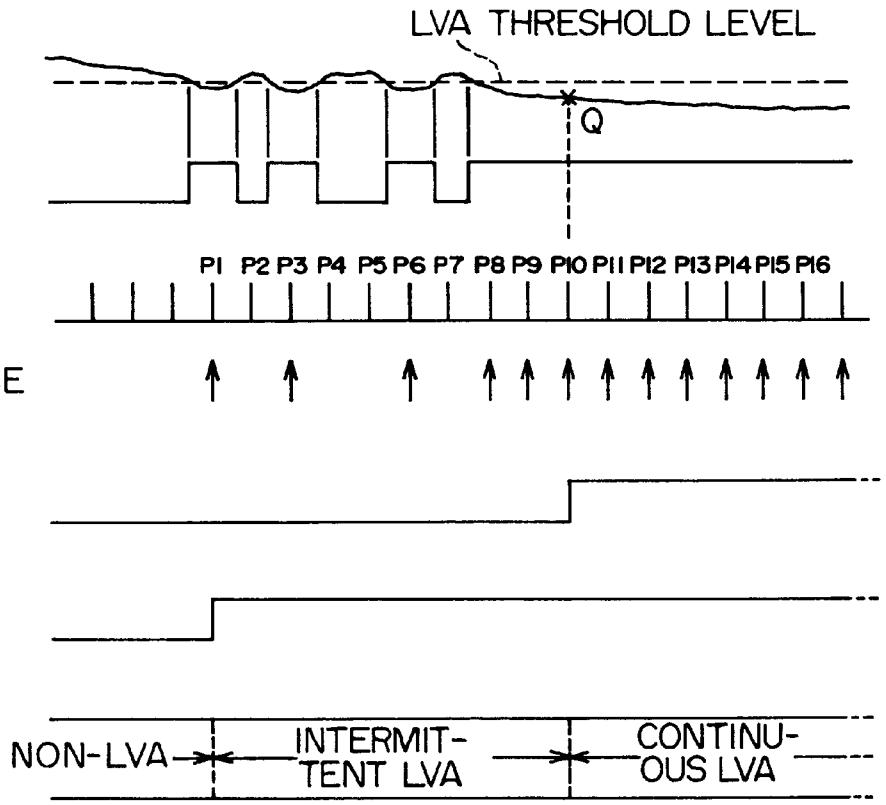
FIG. 3a BATTERY VOLTAGE
FIG. 3b LV SIGNAL
FIG. 3c DETECTION CLOCK
FIG. 3d TIMING DETERMINED TO BE FOR GENERATION OF LVA
FIG. 3e GATE 20a
FIG. 3f GATE 20b
FIG. 3g LVA MODE

BATTERY VOLTAGE ALARM APPARATUS

Matter enclosed in heavy brackets [ ] appears in the original patent but forms no part of this reissue specification; matter printed in italics indicates the additions made by reissue.

BACKGROUND OF THE INVENTION

The present invention relates to a battery voltage alarm apparatus for use in a paging receiver and the like.

In a conventional radio paging system, subscribers are sorted into a plurality of groups, a plurality of receiving units are assigned with individual identification numbers and paged by using the identification numbers, and each signal unit drives, upon receipt of a paging signal, an announcing circuit to cause it to raise a ringing or other announcing means which informs the user of the occurrence of paging. In this system, it is preferable that paging be confirmed without fail even when the user is staying at any place and in the paging receiver, detection of a decrease in voltage of a power supply battery and consequent exchange of the battery at good timing are of a very important procedure for the sake of maintaining receiving sensitivity. Accordingly, the battery voltage detecting function is so designed as to raise a battery low voltage alarm (hereinafter simply referred to as LVA) of continuous ringing or other announcing means so that the user may be urged to exchange the battery. The LVA is one of various kinds of alarms, including reception announcing means.

However, the conventional LVA faces the following problems.

(1) When power supply voltage is decreased so as to raise an alarm during a user's sleep at night or during a long absence of the user, the alarm is noticed by the user and yet the LVA is continued until eventual complete exhaustion of the battery and consequent interruption of the alarm, with the result that the user cannot be informed of the timing for battery exchange. Taking the occurrence of a decreased voltage occurring during a user's sleep at night, for instance, the alarm must be raised continuously for about 7 to 10 hours before the user wakes, but it is almost impossible to continue the alarm for such a long time with a battery having a low or decreased voltage.

(2) If the LVA is mistaken for a paging alarm and resetting is effected, then the LVA will never be raised again and the timing for battery change will be missed.

The present invention intends to solve these problems.

SUMMARY OF THE INVENTION

An object of the present invention is to reduce power consumption during an alarm raised in the event of a decrease in battery voltage so as to permit a long-term activity of the alarm.

A preferred embodiment of the invention is with the aim of informing the user of an LVA without fail by raising an alarm again at the termination of a predetermined interval of time even if the LVA is brought into resetting.

According to the invention, to accomplish the above objects, a plurality of steps of LVA detection levels are set, and alarms are made to be different for individual detection levels.

In the preferred embodiment of the invention, means is provided for raising an alarm again at the termination of the predetermined interval of time following resetting of the alarm.

BRIEF DESCRIPTION OF THE DRAWINGS

FIGS. 3a–3g are timing chart of various signals used during the LVA operation in the apparatus;

DESCRIPTION OF THE PREFERRED EMBODIMENTS

Figure 1:
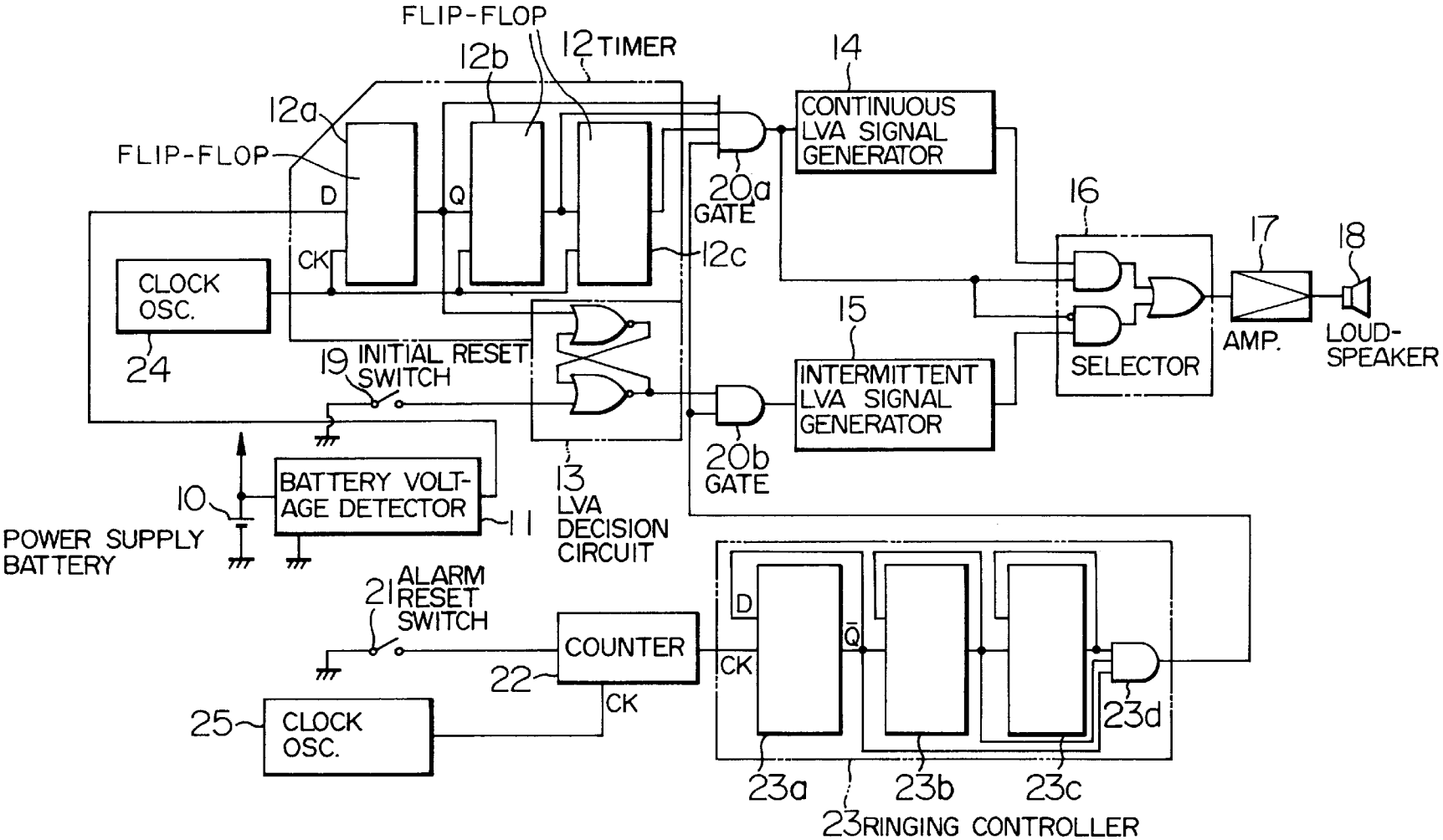
FIG. 1 is a block diagram showing construction of a battery voltage alarm apparatus according to an embodiment of the invention.

FIG. 1 is a block diagram showing construction of a battery voltage alarm apparatus according to an embodiment of the invention. Referring to FIG. 1, there are seen a power supply battery 10 and a battery voltage detector 11 for LVA start. A timer 12, for detecting a continuous LVA waveform which begins with LVA start time, is comprised of D flip-flops 12a, 12b and 12c. There are also seen an LVA decision circuit 13 comprised of a latch circuit and operative to detect an LVA, a continuous LVA signal generator 14, an intermittent LVA signal generator 15, *wherein the signals are either electrical signals or initiating signals,* a selector 16 for selecting an intermittent or continuous LVA signal, an amplifier 17 and a loudspeaker 18 which process an LVA signal to raise an alarm, conditioning gates 20a and 20b for starting generation of continuous LVA and generation of intermittent LVA, respectively, an initial reset switch 19, an alarm pause (reset) switch 21, a counter 22 for measuring the lapse of a predetermined time following resetting, and a ringing controller for suppressing the LVA signal only during operation of the counter 22. The ringing controller 23 includes D flip-flops 23a, 23b and 23c and and an AND gate 23d. Reference numerals 24 and 25 designate clock signal oscillators.

Operation of the above embodiment will now be described with reference to FIGS. 2 to 6.

Figure 2:
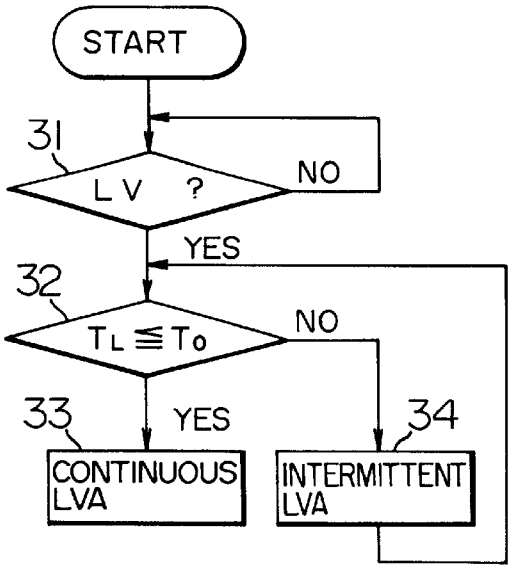
FIG. 2 is a flow chart of LVA operation in the apparatus.

In the above embodiment, the battery voltage alarm apparatus is first initialized by means of the initial reset switch 19. The battery voltage detector 11 monitors voltage of the power supply battery 10 to produce an ON signal (LV signal) when it detects the value of voltage falling below a predetermined LVA threshold level (for example, 1.1 V). This behavior is shown in FIG. 3. More particularly, when voltage of the power supply battery 10 is above the LVA threshold level, the battery is in normal condition and this period corresponds to a non-LVA mode in which no LVA is generated as shown at voltage waveform g in FIG. 3. Subsequently, when the battery voltage is so consumed as to fall below the LVA threshold level as shown at voltage waveform a in FIG. 3, the battery voltage detector 11 generates an LV signal during an interval of time as shown at voltage waveform b in FIG. 3 in which the battery voltage falls below the LVA threshold level. The procedure till then corresponds to step 31 in FIG. 2. When the LV signal is detected in step 31, the program proceeds to step 32. The LV signal thus detected by the battery voltage detector 11 is supplied to a D terminal of the D flip-flop 12a included in the timer 12. On the other hand, a detection clock 12d as shown at waveform c in FIG. 3 which is generated from the clock oscillator 24 is applied to the other terminal of the D flip-flop 12a, so that in the presence of a clock pulse of detection clock 12d during duration of the LV signal, the D flip-flop 12d drives the LVA decision circuit 13 to determine that the timing is for generation of LVA. This behavior is shown at waveforms c and d in FIG. 3. At the timing which is firstly determined to be for generation of LVA by means of the LVA decision circuit 13, that is, at the timing indicated by P1 at waveform c in FIG. 3, the output of the gate 20b is turned on as shown at waveform f in FIG. 3 to drive the intermittent LVA signal generator 15, thus generating an intermittent LVA signal. At that time, the timer 12 starts counting clock pulses of detection clock 12d within duration of the LV signal to monitor the duration time of low voltage condition, whereby if a timer count value To is smaller than a predetermined time $T_L$, the LVA mode is switched to intermittent LVA but if exceeds $T_L$, the LVA mode is switched to continuous LVA. More specifically, as shown in FIG. 2, it is decided in step 32 whether the timer count value To exceeds $T_L$ and if To exceeds $T_L$, continuous LVA is selected as shown in step 33 but if To is smaller than $T_L$, intermittent LVA is selected as shown in step 34. Timing for this procedure will be described with reference to FIG. 3. It is now assumed that the predetermined time $T_L$ is so set as to be equal to time for counting three clock pulses of detection clock 12d. Before timing point P1 on the detection clock 12d, the power supply battery 10 sustains voltage in excess of the LVA threshold level and operation leading to delivery of LVA signal is not carried out. When the voltage of the power supply battery 10 falls below the LVA threshold level temporarily, the battery voltage detector 11 generates an LV signal during an interval of time in which the voltage is below the threshold level and the gate 20b is opened at timing P1 that a clock pulse of detection clock 12d is counted during duration of the LV signal, causing the intermittent LVA signal generator 15 to supply an intermittent LVA signal to the selector 16. On the other hand, since the duration of the LV signal is shorter than the predetermined time $T_L$, the gate 20a remains closed. This is true for timings P3 and P6. Accordingly, during the above operation, the selector 16 supplies the LVA intermittent signal to the amplifier 17 and an amplified intermittent LVA signal is processed by the loudspeaker 18 to raise an alarm A. This behavior is shown at g in FIG. 3.

When voltage of the power supply battery 10 continues being below the LVA threshold level and three clock pulses of detection clock 12d are counted, that is, clock pulses at timings P8, P9 and P10 shown at waveform c in FIG. 3 are counted, the predetermined time $T_L$ is counted over and the gate 20a is turned on as shown at waveform e in FIG. 3. As a result, the continuous LVA signal generator 14 is driven to supply a continuous LVA signal to the selector 16 which in turn supplies the continuous LVA signal to the loudspeaker 18 through the amplifier 17 to raise an alarm B of continuous sound.

Figure 4A:
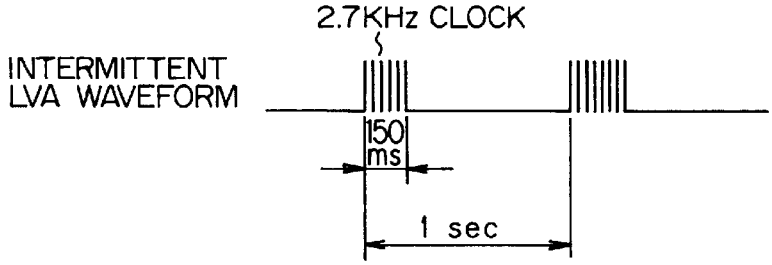
FIGS. 4a–4b are waveform diagram showing an embodiment of LVA signal waveforms in the apparatus.
Figure 4B:
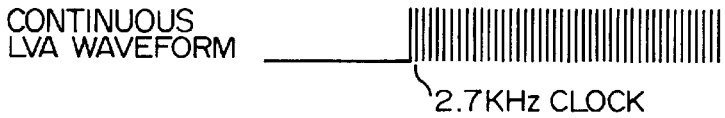

FIG. 4 illustrates at sections a and b examples of output waveforms of intermittent and continuous LVA signals, respectively, which have a fundamental ringing frequency of 2.7 KHz. In the intermittent LVA signal shown at a in FIG. 4, a sound at 2.7 KHz is raised, for example, for 150 milliseconds and this ringing is repeated intermittently at intervals of one second and in the continuous LVA signal shown at b in FIG. 4, a sound at 2.7 KHz is raised continuously.

The alarms A and B may be modified in various ways to take sound forms other than the aforementioned intermittent and continuous sounds. Preferably, in a sound used as alarm A, power consumption is as small as possible, the sound volume is low and the intermittent interval is large. On the other hand, a sound used as alarm B differs in volume, tone and ringing interval from the sound of alarm A so that the alarm B may be distinguishable from the alarm A. For the alarm B, power consumption is contrived to be minimized, thereby permitting the alarm sound to be raised for a long time.

Ringing of the aforementioned alarms A and B can be stopped temporarily or can be brought into a pause by means of the alarm reset switch 21 (for example, a pushbutton switch) shown in FIG. 1.

This behavior will be described by referring to a flow chart of FIG. 5 and a waveform diagram of FIG. 6.

Figure 5:
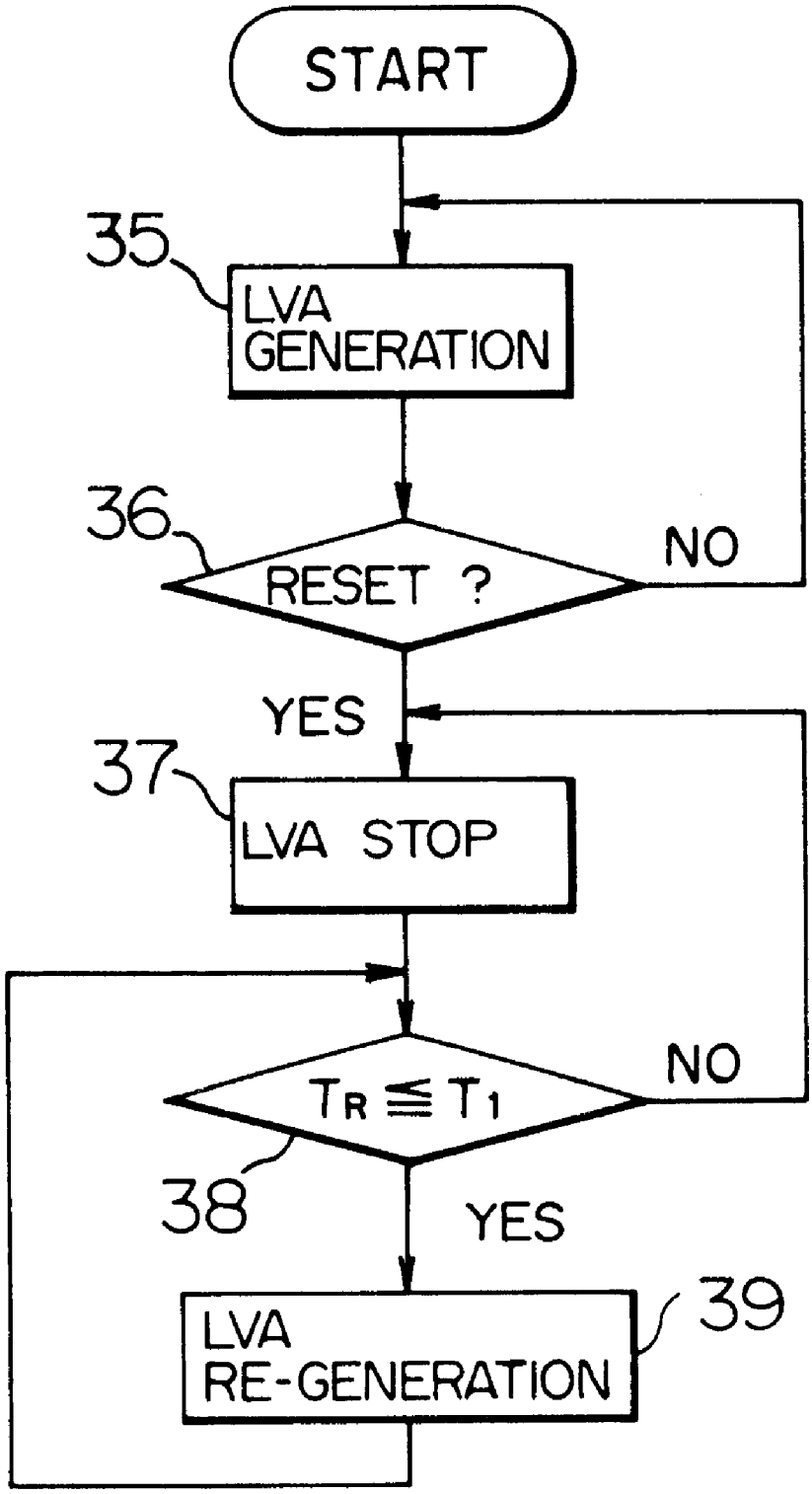
FIG. 5 is a flow chart of LVA resetting operation in the apparatus.
Figures 6A, 6B, 6C, 6D, 6E:
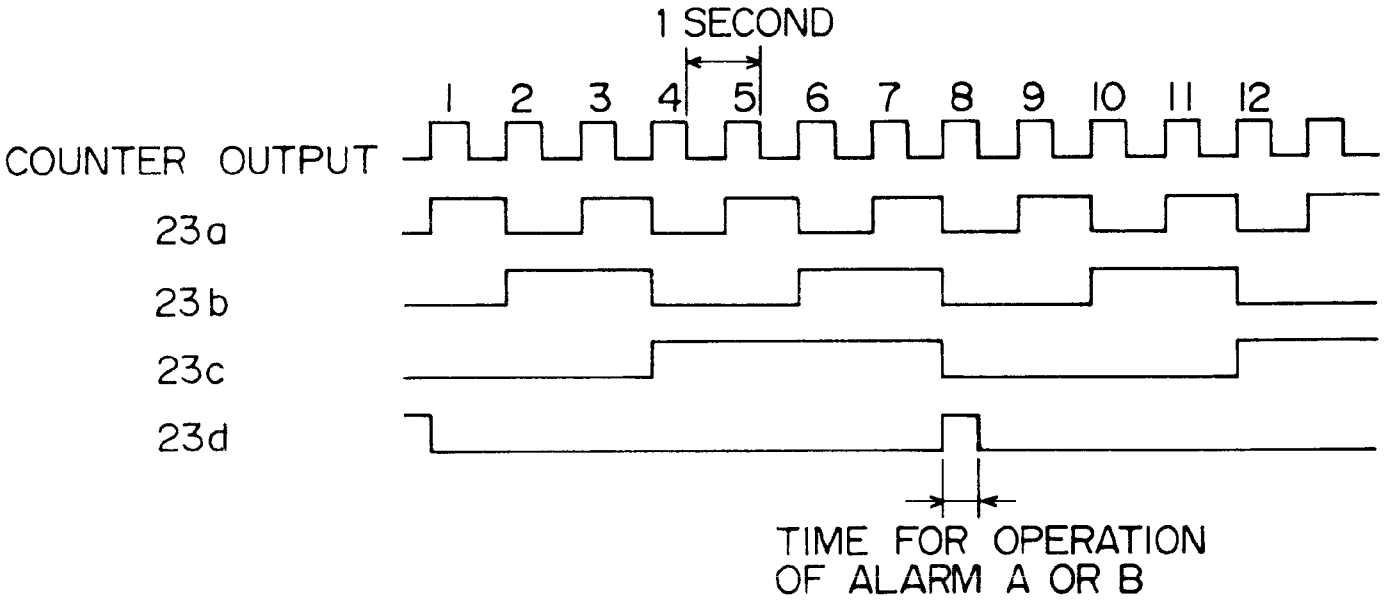
FIGS. 6a–6e are timing chart of various signals used during the LVA resetting in the apparatus.

In step 35 shown in FIG. 5, an LVA is generated to raise an alarm A or B. When under this condition the alarm reset switch 21 is turned on, resetting is so determined in step 36 as to issue "YES" and in step 37 the LVA is stopped.

Concurrently with turn-on of the alarm reset switch 21, the counter 22 is rated to drive the ringing controller 23. More specifically, the counter 22 starts counting clock pulses generated from the clock signal oscillator 25 to produce an output clock as shown at waveform a in FIG. 6 which in turn is supplied to the ringing controller 23. The D flip-flops 23a, 23b and 23c included in the ringing controller 23 respectively deliver pulse waveforms shown at b, c and d in FIG. 6. Consequently, the AND gate 23 generates a pulse each time that 8 clock pulses of output clock of the counter 22 are counted over as shown at e in FIG. 6 and the thus generated pulse is supplied to the gates 20a and 20b to open the same. As a result, the alarm A or B selected by the selector 16 is raised at a predetermined interval of time. This behavior is shown at steps 38 and 39 in FIG. 5. In step 38, it is decided whether count value T1 of the counter 22 equals a predetermined value $T_R$, that is, 8 in the aforementioned example and if equality stands, the LVA is generated again in step 39.

The counter 22 may be designed to circulate through values, for example, 0 to $T_R$ in order that the LVA can be generated again at an interval of $T_R$. Accordingly, even when the LVA is reset by means of the alarm reset switch 21 to cause the alarm to pause, the generation of the LVA continues to repeat itself at a predetermined period to inform the user of the necessity for battery exchange without fail.

In order to raise the alarm with low power consumption, the alarm sound may be an intermittent ringing or a low-volume sound. In this case, the intermittent sound can have any kind of rhythms.

The LVA has been described as being detected by detecting the threshold level and the interval of time during which voltage is below the threshold level but different two levels may be set as threshold levels and mutually different alarms may be raised at the respective levels. For example, a voltage level at point Q shown at a in FIG. 3 (corresponding to timing P10 for a clock pulse shown at c in FIG. 3) may be defined as a second LVA threshold level and a second alarm of, for example, continuous sound may be raised at this threshold level.

The number of steps of LVA detection levels is not limited to two, but in general a plurality of levels may be used wherein the alarm to be raised at a higher level may be generated with low power consumption.

According to the present embodiment of the invention, a plurality of steps of LVA detection level, for example, two steps A and B are used and in accordance with these levels, alarm A is operated intermittently with low power consumption to produce an LVA of low output volume and alarm B is continuously operated to produce an LVA of high volume, so that when battery voltage decreases to the LVA level of alarm A, the alarm A of low power consumption is first generated to announce a decrease in voltage and subsequently when the battery voltage decreases to the lower LVA level at the termination of a predetermined interval of time, the continuous or high-volume LVA is generated to urge the user to exchange the battery. The alarms A and B are temporarily stoppable (resettable) but the timer is started by the resetting operation to generate again an LVA at another termination of the predetermined interval of time. Thus, a chance to exchange the battery will never be missed to advantageously permit positive exchange of battery and interruption of operation (communication) due to a decrease in battery voltage caused by continuing resetting effected by mistaking a paging sound for an alarm can advantageously be prevented.

I claim:

1. A battery voltage alarm apparatus comprising:

means for determining when a battery voltage is below a predetermined voltage level and for generating a first control signal anytime that said battery voltage is below said predetermined voltage level and a second control signal only when the battery voltage remains below said predetermined voltage level for a predetermined period of time;

first alarm generation means, to be driven by the first control signal, for generating a first alarm; and second alarm generation means, to be driven by the second control signal, for generating a second alarm.

2. A battery voltage alarm apparatus according to claim 1, wherein said first alarm is an intermittent sound.

3. A battery voltage alarm apparatus according to claim 1, wherein said first alarm is a low-volume sound.

4. A battery voltage alarm apparatus according to claim 1, further comprising:

switch means for temporarily stopping said first and second alarm generation means; and means, associated with said switch means, for counting a second interval of time upon activation of said switch means and for re-starting said first and second alarm generation means after completion of said second interval of time.

5. A battery voltage alarm apparatus according to claim 1, wherein the means for generating the first and second control signals includes timer means for timing said predetermined period of time, and said timer means is reset when said battery voltage is above said predetermined level.

6. A battery voltage alarm apparatus according to claim 1, wherein said second alarm consumes a different amount of power than said first alarm.

7. A battery voltage alarm apparatus comprising:

means for detecting battery voltage and for generating a first control signal when said battery voltage is below a predetermined level;

means for measuring an interval of time during which the battery voltage detected by said means for detecting remains below said predetermined level and for generating a second control signal only when said battery voltage remains below said predetermined level for a predetermined period of time; and means for generating a first alarm in response to said first control signal and generating a second alarm in response to said second control signal.

8. A battery voltage alarm apparatus according to claim 7, wherein said first alarm is an intermittent sound and said second alarm is a continuous sound.

9. A battery voltage alarm apparatus according to claim 7, further comprising:

means for selectively stopping at least one of said first and second alarms; and means for counting a second interval of time upon activation of said means for selectively stopping at least one of said first and second alarms and for raising said at least one of said first and second alarms again at the termination of said second interval of time.

10. A battery voltage alarm apparatus according to claim 7, wherein said means for measuring an interval of time during which the battery voltage remains below said predetermined level includes timer means for timing said predetermined period of time, and said timer means is reset when said battery voltage is above said predetermined level.

11. A battery voltage alarm apparatus according to claim 7, wherein said second alarm consumes a different amount of power than said first alarm.

12. A battery voltage alarm apparatus comprising:

means for detecting a first level of battery voltage;

means for detecting a second level of battery voltage;

means for generating a first alarm when said first level is detected;

means for generating a second alarm when said second level is detected;

means for selectively stopping at least one of said first and second alarms; and means for counting an interval of time upon activation of said means for selectively stopping at least one of said first and second alarms and for restarting said first and second alarms after completion of said interval of time.

13. A battery voltage alarm apparatus according to claim 12, wherein said first and second alarms are of different alarm sounds.

14. A battery voltage alarm apparatus according to claim 12, wherein said first alarm is an intermittent sound and said second alarm is a continuous sound.

15. A battery voltage alarm apparatus according to claim 12, wherein said second alarm consumes a different amount of power than said first alarm.

*16. A battery voltage monitoring apparatus for a telecommunications device, comprising:*

*means for determining when a battery voltage is below a predetermined voltage level and for generating a first control signal anytime that said battery voltage is below said predetermined voltage level and a second control signal only when the battery voltage remains below said predetermined voltage level for a predetermined period of time;*

*first signal generation means, to be driven by the first control signal, for generating and outputting a first electrical signal indicating that said battery voltage is below said predetermined voltage level; and*

*second signal generation means, to be driven by the second control signal, for generating a second electrical signal indicating that said battery voltage has remained below said predetermined voltage level for said predetermined period of time and outputting said second electrical signal to another circuit element of said battery voltage monitoring apparatus.*

*17. A battery voltage monitoring apparatus according to claim 16, further comprising:*

*switch means for selectively stopping at least one of said first and second signal generation means; and*

*means, associated with said switch means, for counting a second interval of time upon activation of said switch*

*means and for restarting said at least one of said first and second signal generation means after completion of said second interval of time.*

*18. A battery voltage monitoring apparatus according to claim 16, wherein said means for generating the first and second control signals includes timer means for timing said predetermined period of time, and said timer means is reset when said battery voltage is above said predetermined level.*

*19. A battery voltage monitoring apparatus according to claim 16, wherein said second signal generating means outputting said second electrical signal consumes a different amount of power than said first signal generating means outputting said first electrical signal.*

*20. A battery voltage monitoring apparatus for a telecommunications device, comprising:*

*means for determining when a battery voltage is below a predetermined voltage level and for generating a first control signal anytime that said battery voltage is below said predetermined voltage level and a second control signal only when the battery voltage remains below said predetermined voltage level for a predetermined period of time;*

*first means, to be driven by the first control signal, for generating and outputting a first initiating signal to initiate a first control procedure in said monitoring apparatus responsive to said battery voltage being below said predetermined voltage level; and*

*second means, to be driven by the second control signal, for generating a second initiating signal to initiate a second control procedure in said monitoring apparatus responsive to said battery voltage remaining below said predetermined voltage level for said predetermined period of time and outputting said second initiating signal to another circuit element of said battery voltage monitoring apparatus.*

*21. A battery voltage monitoring apparatus according to claim 20, further comprising:*

*means for selectively stopping at least one of said first and second means; and*

*means for counting a second interval of time upon activation of said means for selectively stopping said at least one of said first and second means and for restarting said at least one of said first and second means again at the termination of said second interval of time.*

*22. A battery voltage monitoring apparatus according to claim 20, wherein the means for generating the first and second control signals includes timer means for timing said predetermined period of time, and said timer means is reset when said battery voltage is above said predetermined level.*

*23. A battery voltage monitoring apparatus according to claim 20, wherein said second means outputting said second initiating signal consumes a different amount of power than said first means outputting said first initiating signal.*

*24. A battery voltage monitoring apparatus for a telecommunications device, comprising:*

*means for determining when a battery voltage is below a predetermined voltage level and for generating a first control signal anytime that said battery voltage is below said predetermined voltage level and a second control signal only when the battery voltage remains below said predetermined voltage level for a predetermined period of time;*

*alarm generation means, to be driven by the first control signal, for generating an alarm; and*

*signal generation means, to be driven by the second control signal, for generating an electrical signal indicating that said battery voltage has remained below said predetermined voltage level for said predetermined period of time and outputting said electrical signal to another circuit element of said battery voltage monitoring apparatus.*

*25. A battery voltage monitoring apparatus according to claim 24, further comprising:*

*switch means for selectively stopping at least one of said alarm generation means and signal generation means; and*

*means, associated with said switch means, for counting a second interval of time upon activation of said switch means and for restarting said at least one of said alarm generation means and said signal generation means after completion of said second interval of time.*

*26. A battery voltage monitoring apparatus according to claim 24, wherein the means for generating the first and second control signals includes timer means for timing said predetermined period of time, and said timer means is reset when said battery voltage is above said predetermined level.*

*27. A battery voltage monitoring apparatus according to claim 24, wherein said signal generation means outputting said electrical signal consumes a different amount of power than said alarm generating means outputting said alarm.*

*28. A battery voltage monitoring apparatus for a telecommunications device, comprising:*

*means for determining when a battery voltage is below a predetermined voltage level and for generating a first control signal anytime that said battery voltage is below said predetermined voltage level and a second control signal only when the battery voltage remains below said predetermined voltage level for a predetermined period of time;*

*alarm generation means, to be driven by the first control signal, for generating an alarm; and*

*means, to be driven by the second control signal, for generating an initiating signal to initiate a control procedure responsive to said battery voltage remaining below said predetermined voltage level for said predetermined period of time and outputting said initiating signal to another circuit element of said battery voltage monitoring apparatus.*

*29. A battery voltage monitoring apparatus according to claim 28, further comprising:*

*means for selectively stopping at least one of said alarm generation means and said initiating signal generation means; and*

*means for counting a second interval of time upon activation of said means for selectively stopping at least one of said alarm generation means and said initiating signal generation means and for restarting said at least one of said alarm generation means and said initiating signal generation means again at the termination of said second interval of time.*

*30. A battery voltage monitoring apparatus according to claim 28, wherein the means for generating the first and second control signals includes timer means for timing said predetermined period of time, and said timer means is reset when said battery voltage is above said predetermined level.*

*31. A battery voltage monitoring apparatus according to claim 28, wherein said initiating signal generation means outputting said initiating signal consumes a different amount of power than said alarm generation means generating said alarm.*

*32. A battery voltage monitoring apparatus for a telecommunications device, comprising:*

*means for determining when a battery voltage is below a predetermined voltage level and for generating a first control signal anytime that said battery voltage is below said predetermined voltage level and a second control signal only when the battery voltage remains below said predetermined voltage level for a predetermined period of time;*

*alarm generation means, to be driven by the first control signal, for generating an alarm;*

*means, to be driven by the second control signal, for generating an initiating signal to initiate a control procedure in said battery monitoring apparatus responsive to said battery voltage remaining below said predetermined voltage level for said predetermined period of time; and*

*a control means, responsive to said initiating signal, for performing said control procedure.*

*33. A battery voltage monitoring apparatus according to claim 32, further comprising:*

*means for selectively stopping at least one of said alarm generation means and said initiating signal generation means; and*

*means for counting a second interval of time upon activation of said means for selectively stopping at least one of said alarm generation means and said initiating signal generation means and for restarting said at least one of said alarm generation means and said initiating signal generation means again at the termination of said second interval of time.*

*34. A battery voltage monitoring apparatus according to claim 32, wherein the means for generating the first and second control signals includes timer means for timing said predetermined period of time, and said timer means is reset when said battery voltage is above said predetermined level.*

*35. A battery voltage monitoring apparatus according to claim 32, wherein said initiating signal generations means outputting said initiating signal consumes a different amount of power than said alarm generation means generating said alarm.*

*36. A battery voltage monitoring apparatus for a telecommunications device, comprising:*

*means for determining when a battery voltage is below a predetermined voltage level and for generating a first control signal anytime that said battery voltage is below said predetermined voltage level and a second control signal only when the battery voltage remains below said predetermined voltage level for a predetermined period of time;*

*first means, to be driven by the first control signal, for generating a first initiating signal to initiate a first control procedure in said battery monitoring apparatus responsive to said battery voltage being below said predetermined voltage level;*

*second means, to be driven by the second control signal, for generating a second initiating signal to initiate a second control procedure in said battery monitoring apparatus responsive to said battery voltage remaining below said predetermined voltage level for said predetermined period of time; and*

*a control means, responsive to said second initiating signal, for performing said second control procedure.*

*37. A battery voltage monitoring apparatus according to claim 36, further comprising:*

*means for selectively stopping at least one of said first and second means; and*

*means for counting a second interval of time upon activation of said means for selectively stopping said at least one of said first and second means and for restarting said at least one of said first and second means again at the termination of said second interval of time.*

*38. A battery voltage monitoring apparatus according to claim 36, wherein the means for generating the first and second control signals includes timer means for timing said predetermined period of time, and said timer means is reset when said battery voltage is above said predetermined level.*

*39. A battery voltage monitoring apparatus according to claim 36, wherein said second means outputting said second initiating signal consumes a different amount of power than said first means outputting said first initiating signal.*

* * * * *